(12) United States Patent
Ishimaru et al.

(10) Patent No.: US 8,130,342 B2
(45) Date of Patent: Mar. 6, 2012

(54) LIQUID CRYSTAL DISPLAY DEVICE AND COLOR FILTER FOR LIQUID CRYSTAL DISPLAY DEVICE

(75) Inventors: Yoshiko Ishimaru, Tokyo (JP);
Hidesato Hagiwara, Tokyo (JP);
Yoshinori Murazaki, Anan (JP);
Suguru Takashima, Anan (JP);
Masafumi Harada, Anan (JP)

(73) Assignees: Toppan Printing Co., Ltd., Tokyo (JP);
Nichia Corporation, Tokushima (JP)

( * ) Notice: Subject to any disclaimer, the term of this patent is extended or adjusted under 35 U.S.C. 154(b) by 198 days.

(21) Appl. No.: 12/659,188

(22) Filed: Feb. 26, 2010

(65) Prior Publication Data
US 2010/0296024 A1    Nov. 25, 2010

Related U.S. Application Data

(63) Continuation of application No. PCT/JP2008/064825, filed on Aug. 20, 2008.

(30) Foreign Application Priority Data

Aug. 30, 2007   (JP) ................ 2007-224445

(51) Int. Cl.
*G02F 1/1335* (2006.01)
(52) U.S. Cl. ........................................... 349/71
(58) Field of Classification Search ............. None
See application file for complete search history.

(56) References Cited

U.S. PATENT DOCUMENTS

| | | | |
|---|---|---|---|
| 2005/0110923 A1* | 5/2005 | Yamashita et al. | ............ 349/107 |
| 2006/0076883 A1 | 4/2006 | Himaki et al. | |
| 2006/0226759 A1 | 10/2006 | Masuda et al. | |
| 2007/0200095 A1 | 8/2007 | Murazaki | |
| 2011/0242437 A1* | 10/2011 | Yoo et al. | ............ 348/790 |

FOREIGN PATENT DOCUMENTS

| | | |
|---|---|---|
| EP | 1 816 179 | 8/2007 |
| JP | 2003-185830 | 7/2003 |
| JP | 2004-184737 | 7/2004 |
| JP | 2004-189997 | 7/2004 |
| JP | 2006-306981 | 11/2006 |
| JP | 2007-39571 | 2/2007 |
| JP | 2007-47781 | 2/2007 |
| JP | 2007-49114 | 2/2007 |

OTHER PUBLICATIONS

English Translation of the International Preliminary Report on Patentability mailed Mar. 18, 2010 in corresponding International Patent Application PCT/JP2008/064825.
International Search Report for PCT/JP2008/064825, mailed on Sep. 30, 2008.

* cited by examiner

*Primary Examiner* — Sung Pak

(57) ABSTRACT

Disclosed a liquid crystal display device including a backlight device including a white-emitting LED device which emits a white light arising from a color mixture created through a combination of a blue-emitting LED, a red-emitting phosphor and a green-emitting phosphor, and a color filter equipping color pixels exhibiting plural colors including a red pixel and formed on a transparent substrate, wherein the white-emitting LED device is enabled to exhibit an emission spectrum having a first peak wavelength falling within a range of 440-470 nm, a second peak wavelength falling within a range of 510-550 nm and a third peak wavelength falling within a range of 630-670 nm, and a red display chromaticity of the liquid crystal display device is confined within a region bounded by lines connecting four points (0.620, 0.280), (0.620, 0.300), (0.680, 0.315) and (0.680, 0.280) based on an xy chromaticity coordinate system.

11 Claims, 5 Drawing Sheets

LIQUID CRYSTAL DISPLAY DEVICE AND COLOR FILTER FOR LIQUID CRYSTAL DISPLAY DEVICE

CROSS REFERENCE TO RELATED APPLICATIONS

This application is a U.S. Continuation Application claiming priority benefit under 35 U.S.C. Section 1.53(b), of PCT International Application No. PCT/JP2008/064825, filed Aug. 20, 2008, which claims earlier priority benefit to Japanese Application No. 2007-224445, filed Aug. 30, 2007, the entire disclosures of which are incorporated by reference as a part of this application.

BACKGROUND OF THE INVENTION

1. Field of the Invention

The present invention relates to a liquid crystal display device and, in particular, to a liquid crystal display device which is excellent in red reproducibility, and is equipped with a white-emitting LED device as a backlight device employing a combination of a blue-emitting LED and red/green phosphors and also equipped with a color filter having red pixels which are capable of exhibiting excellent red color reproducing properties well matched with this backlight device. Further, the present invention relates to a color filter to be used in such a liquid crystal display device. In particular, the present invention is quite applicable to an on-vehicle liquid crystal display device.

2. Description of the Related Art

At present, an on-vehicle liquid crystal display device is in widespread use rapidly especially centering around a car navigation device and a rear seat monitor. In addition to that, there is a trend to mount a liquid crystal display device as an instrument panel in recent years. Where a liquid crystal display device is applied to the instrument panel, added values, which are quite different from the conventional analog meters, are provided.

In the case of the conventional on-vehicle liquid crystal display device such as a car navigation device, a rear seat monitor, etc., a cold cathode fluorescent lamp (CCFL), which is employed in ordinary liquid crystal display devices, has been employed as a backlight device. However, the cold cathode fluorescent lamp is accompanied with problems that it is poor in responsibility, weak in vibration and in shock, and adverse to environments due to the mercury contained in the cold cathode fluorescent lamp.

Further, a so-called ELV directive (End of Life vehicles directive) was put into force against vehicle components in October 2000 in the European Union. According to this regulation, it is stipulated to reduce the usage amount of Pb, Hg and $Cr^{6+}$ to not more than 1000 pm and also to reduce the usage amount of Cd to not more than 100 pm in cars, buses and trucks to be registered in the EU markets starting from Jul. 1, 2003. This regulation aims at promoting the utilization, recycling and reclamation of waste matters of scrapped motor cars.

The on-vehicle display device is also one of the objects to be regulated by this regulation, so that the backlight device for these display devices is increasingly executed by making use of light-emitting diodes (LEDs) which are mercury-free in place of the conventional cold cathode fluorescent lamp where mercury is employed.

With respect to the LED backlight device, there are known a 3-wavelength white-emitting LED device where a 3-color LED light source consisting of a red LED light source, a green LED light source and a blue-emitting LED light source is employed (see Jpn. Pat. Appln. KOKAI Publication No. 2007-47781, for example), and a white-emitting LED device where the light to be emitted from a blue-based LED is color-mixed by passing it through a phosphor such as yttrium-aluminum-garnet (YAG), etc. Among them, the white-emitting LED device is widely employed in recent years as a small liquid display device to be used in mobile monitoring devices.

As far as the LED for the backlight device is concerned, since the three-color LED is low in cost merit in terms of individual variation and manufacturing cost, the white-emitting LED device is mainly used at present, so that the cold cathode fluorescent lamp that has been used as a backlight device for an on-vehicle liquid crystal display device is expected to be gradually replaced by the white-emitting LED device.

However, the employment of the white-emitting LED device as a backlight device is accompanied with a problem that since the white-emitting LED device does not exhibit an emission peak in a long wavelength region, the color reproducibility of the red display of liquid display device is prominently deteriorated. Whereas, in the case of the display to be mounted on a vehicle, it attaches importance very much to the red reproducibility as seen in the case of alarm display, etc. For this reason, there are great demands for an on-vehicle liquid crystal display device which is excellent in red reproducibility while making it possible to use, as a backlight device, an LED light source which is of high merit in terms of mercury-free.

BRIEF SUMMARY OF THE INVENTION

An object of the present invention is to provide a liquid crystal display device which is capable of exhibiting excellent red reproducing properties.

Another object of the present invention is to provide a color filter to be employed in the aforementioned liquid display device.

According to a first aspect of the invention, there is provided a liquid crystal display device comprising: a backlight device including a white-emitting LED device which emits a white light arising from a color mixture created through a combination of a blue-emitting LED, a red-emitting phosphor and a green-emitting phosphor, and a color filter equipping color pixels exhibiting plural colors including a red pixel on a transparent substrate, wherein the white-emitting LED device is enabled to exhibit an emission spectrum having a first peak wavelength falling within a range of 440-470 nm, a second peak wavelength falling within a range of 510-550 nm and a third peak wavelength falling within a range of 630-670 nm, and a red display chromaticity of the liquid display device is confined within a region bounded by lines connecting four points (0.620, 0.280), (0.620, 0.300), (0.680, 0.315) and (0.680, 0.280) based on an xy chromaticity coordinate system.

According to a second aspect of the invention, there is provided a liquid crystal display device comprising: a backlight device including a white-emitting LED device which emits a white light arising from a color mixture created through a combination of a blue-emitting LED, a red-emitting phosphor and a green-emitting phosphor, and a color filter equipping color pixels exhibiting plural colors including a red pixel on a transparent substrate, wherein the white-emitting LED device is enabled to exhibit an emission spectrum having a first peak wavelength falling within a range of 440-470 nm, a second peak wavelength falling within a range of 510-550 nm and a third peak wavelength falling within a range of 630-670 nm, a minimum relative luminescent intensity in a wavelength range between the second peak wavelength and the third peak wavelength is not more than 70% of lower one of a relative luminescent intensity at the second peak wavelength and a relative luminescent intensity value at the third peak wavelength, and the red pixel has a pigment composition and a film thickness, enabling a red display chromaticity of the liquid crystal display device to confine within a region bounded by lines connecting four points (0.620, 0.280), (0.620, 0.300), (0.680, 0.315) and (0.680, 0.280) based on an xy chromaticity coordinate system.

According to a third aspect of the invention, there is provided a color filter that equips color pixels exhibiting plural colors including a red pixel on a transparent substrate, and is used for a liquid crystal display device as described above.

DETAILED DESCRIPTION OF THE INVENTION

The liquid crystal display device according to one embodiment of the present invention comprises a backlight device including a white-emitting LED device which emits a white light arising from a color mixture created through a combination of a blue-emitting LED, a red-emitting phosphor and a green-emitting phosphor, and color filter equipping color pixels exhibiting plural colors including a red pixel on a transparent substrate. The emission spectrum of the white-emitting LED device has a first peak wavelength falling within a range of 440-470 nm, a second peak wavelength falling within a range of 510-550 nm and a third peak wavelength falling within a range of 630-670 nm. Further, the red display chromaticity of the liquid crystal display device is confined within the region bounded by lines connecting four points (0.620, 0.280), (0.620, 0.300), (0.680, 0.315) and (0.680, 0.280) based on an xy chromaticity coordinate system.

In the case of the liquid crystal display device according to one embodiment of the present invention which is constructed as describe above, since the backlight device thereof is equipped with a white-emitting LED device which emits a white light arising a color mixture created through a combination of a blue-emitting LED, a red-emitting phosphor and a green-emitting phosphor, and the color filter is provided with a red pixel formed of a material which is capable of exhibiting excellent red reproducing properties well matched with this backlight device, it is possible to obtain a liquid crystal display device which is excellent in red reproducing properties. Further, since a mercury-free white-emitting LED device can be employed as a backlight, it is possible, especially when the liquid crystal display device is constructed as use on-vehicle, to promote the utilization, recycling and regeneration of waste materials from discarded motor vehicles.

Next, various embodiments of the present invention will be explained in detail.

Figure 2:
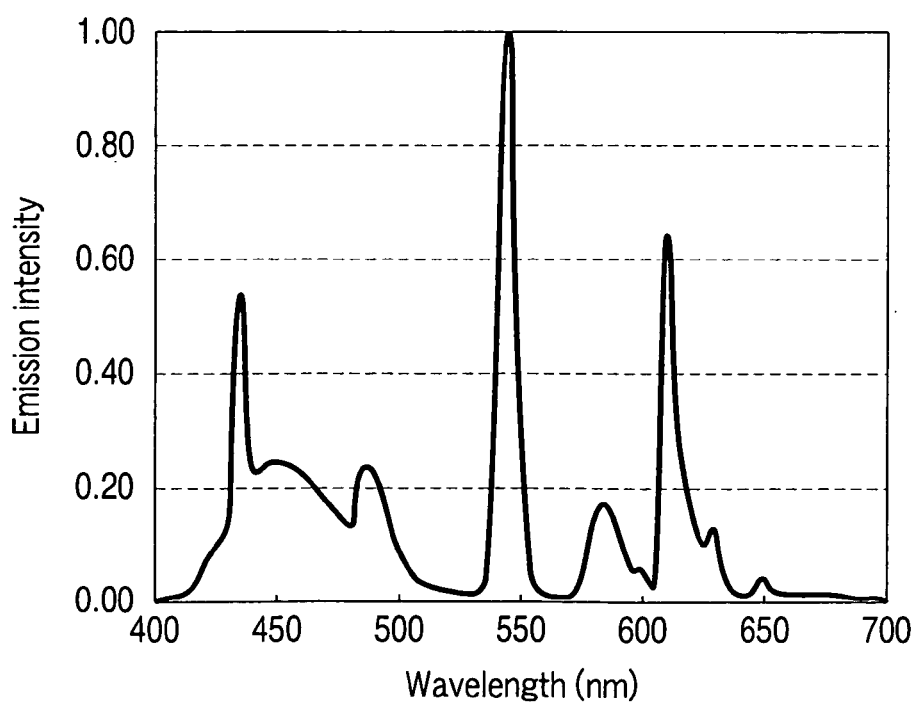
FIG. 2 is a graph illustrating the emission characteristics of a cold cathode fluorescent lamp (CCFL)
Figure 3:
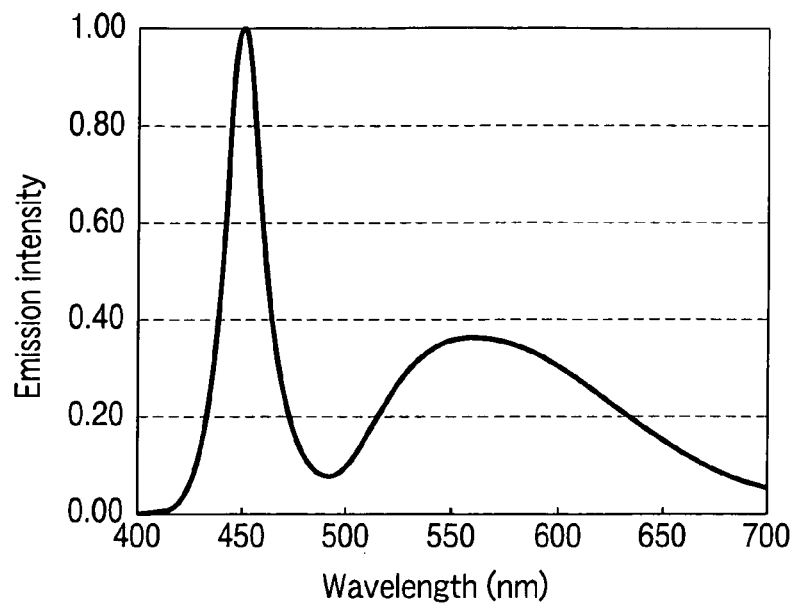
FIG. 3 is a graph illustrating the emission characteristics of a conventional white-emitting LED device.

In the liquid crystal display device according to one embodiment of the present invention, a white-emitting LED device is employed as the backlight device. This white-emitting LED device emits a white light arising from a color mixture created through a combination of a blue-emitting LED, a red-emitting phosphor and a green-emitting phosphor, and is enabled to exhibit an emission spectrum as shown in FIG. 1, which differs from the emission spectrum, as shown in FIG. 2, of a cold cathode fluorescent lamp (CCFL) which has been employed in the conventional liquid crystal display device, and from the emission spectrum, as shown in FIG. 3, of a white-emitting LED device which emits a white light arising from a color mixture created by passing the light emitted from a blue type LED through a phosphor such as yttrium-aluminum-garnet (YAG).

Various alternative devices for the CCFL are now increasingly proposed in order to cope with problems of environments. The white-emitting LED device exhibiting an emission characteristic as shown in FIG. 3, which emits a white light arising from a color mixture created through a combination of a blue-emitting LED and a yellow-emitting phosphor such as YAG, does not exhibit an emission peak in a long wavelength region in contrast to the CCFL. For that reason, this white-emitting LED device is considered as being a 2-wavelength light source since. Accordingly, there is a problem that when the same kind of color filter as that employed in combination with the conventional CCFL is employed as a color filter, the red reproducibility, in particular, is prominently deteriorated so that the inherent red display may be perceived as an orange display.

Figure 1:
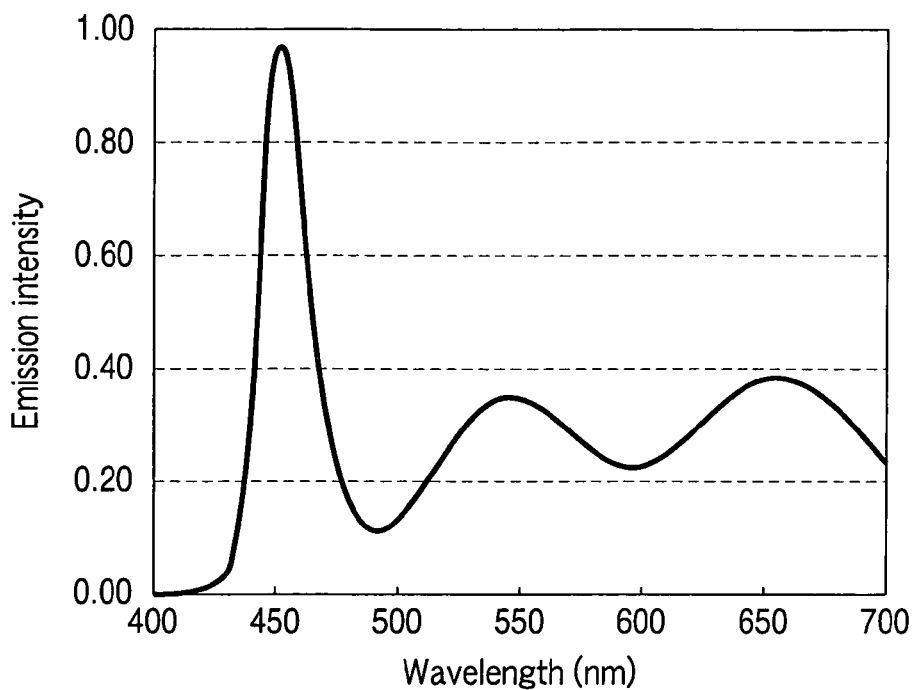
FIG. 1 is a graph illustrating the emission characteristics of a white-emitting LED device which emits a white light arising from a color mixture created through a combination of a blue-emitting LED, a red-emitting phosphor and a green-emitting phosphor.

Whereas, the white-emitting LED device exhibiting an emission characteristic as shown in FIG. 1, emits a white light arising from a color mixture created through a combination of a blue-emitting LED, a red-emitting phosphor and a green-emitting phosphor. In the white-emitting LED device, since two different kinds of phosphors are mixed together, the emission peak thereof becomes a 3-wavelength light source. As a result, the red reproducibility can be greatly enhanced as compared with the white-emitting LED device which emits a white light arising from a color mixture created through a combination of a blue-emitting LED and a yellow-emitting phosphor such as YAG. Especially, when a color filter equipping plural color pixels including red pixel matched with the emission characteristics is employed, it is possible to realize a red display which is far deeper in red as compared with that employing CCFL.

As described above, since the red reproducibility is important as a danger color display especially in the case of the on-vehicle liquid crystal display device, it is strongly needed to make red clearly distinguishable from orange.

Therefore, in the case of the liquid crystal display device of the present invention, since a white-emitting LED device which emits a white light arising from a color mixture created through a combination of a blue-emitting LED, a red-emitting phosphor and a green-emitting phosphor is employed as a backlight device, and, at the same time, a color filter, which has plural color pixels including red pixel matched with the backlight device, is employed, it is possible to realize a deep red chromaticity falling within the region bounded by lines connecting four points (0.620, 0.280), (0.620, 0.300), (0.680, 0.315) and (0.680, 0.280) based on an xy chromaticity coordinate system, thereby solving the aforementioned problem.

The aforementioned range of chromaticity of red is defined based on the finding that, in order to perceive red when the color-reproducing region is 50-95% based on NTSC, the aforementioned range of chromaticity is needed, this finding being obtained as a result of assessment performed while changing the kinds of pigment and composition of the red coloring material for forming the red pixel.

When y value is larger than this range, red may be erroneously perceived as being vermillion color-orange color and when y value is smaller than this range, red may be erroneously perceived as being reddish violet color.

Further, the white-emitting LED device constituting the backlight of the liquid crystal display device according to this embodiment may preferably be constructed such that the emission spectrum thereof has a first peak wavelength falling within the range of 440-470 nm, a second peak wavelength falling within the range of 510-550 nm and a third peak wavelength falling within the range of 630-670 nm, and a minimum relative luminescent intensity in a wavelength range between the second peak wavelength and the third peak wavelength is not more than 70% of lower one of a relative luminescent intensity at the second peak wavelength and a relative luminescent intensity value at the third peak wavelength.

The characteristics of the aforementioned emission spectrum is based on the red display chromaticity to be obtained when the white-emitting LED device is used in combination with a color filter having the same red pixel as that of the white-emitting LED device. If the aforementioned conditions are not satisfied, i.e., if a minimum relative luminescent intensity in a wavelength range between the second peak wavelength and the third peak wavelength is more than 70% of lower one of a relative luminescent intensity at the second peak wavelength and a relative luminescent intensity value at the third peak wavelength, the y value becomes larger than the aforementioned red display chromaticity, resulting in the deterioration of red reproducibility and rendering the red to be perceived as vermillion color or orange color. On the other hand, when the minimum relative luminescent intensity is not more than 70% of lower one of a relative luminescent intensity at the second peak wavelength and a relative luminescent intensity value at the third peak wavelength, the y value can be confined within the range of chromaticity in which red can be perceived. As the minimum relative luminescent intensity in a wavelength range between the second peak wavelength and the third peak wavelength becomes smaller relative to the lower value one of those of the second and the third peak wavelengths, the contribution thereof to increase the deepness of red would become higher as a backlight.

The following are detailed explanation about the red-emitting phosphor and the green-emitting phosphor which are to be employed for the manufacture of a white-emitting LED device having an emission characteristic exhibiting an increased contribution to the deepness of red as described above.

(Red-Emitting Phosphor)

As for the red-emitting phosphor, it is possible to employ a nitride phosphor activated by Eu and containing Group II elements $M^1$, Si, Al, B and N, which is represented by the following general formula (I) and capable of absorbing ultraviolet light or blue light, thereby enabling it to emit red light:

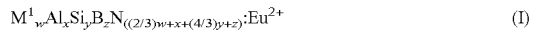
$$M^1{}_wAl_xSi_yB_zN_{((2/3)w+x+(4/3)y+z)}:Eu^{2+} \qquad (I)$$

In this formula (I), $M^1$ is at least one kind of element selected from the group consisting of Mg, Ca, Sr and Ba; and w, x, y and z are numbers preferably satisfying $0.056 \leq w \leq 9$, $x=1$, $0.056 \leq y \leq 18$, $0.0005 \leq z \leq 0.5$, more preferably $0.04 \leq w \leq 3$, $x=1$, $0.143 \leq y \leq 8.7$, $0 \leq z \leq 0.5$, most preferably $0.05 \leq w \leq 3$, $x=1$, $0.167 \leq y \leq 8.7$, $0.0005 \leq z \leq 0.5$, respectively.

Further, z is preferably a number of not more than 0.5, more preferably not more than 0.3 and not less than 0.0005. More preferably, the molar concentration of B (boron) is set to not less than 0.001 and not more than 0.2.

Although it is designed that this nitride phosphor is activated by Eu, a part of Eu may be replaced by at least one kind of rare earth element selected from the group consisting of Sc, Tm, Yb, Y, La, Ce, Pr, Nd, Sm, Gd, Tb, Dy, Ho, Er and Lu.

As for preferable examples of the nitride phosphor, they include those represented by a general formula represented by $M^1{}_{1-z}AlSiB_zN_{((2/3)(1-z)+(7/3)+z)}:Eu^{2+}$. In this formula, $M^1$ is at least one kind of element selected from the group consisting of Mg, Ca, Sr and Ba, the range of x is $0.001 \leq x \leq 0.3$ and the range of z is $0 \leq z \leq 0.5$.

As for other preferable examples of the nitride phosphor, they include those represented by a general formula represented by $M^1{}_wAlSiB_zN_{((2/3)w+(7/3)+z)}:Eu^{2+}$. In this formula, $M^1$ is at least one kind of element selected from the group consisting of Mg, Ca, Sr and Ba, and the ranges of w and z are $0.04 \leq w \leq 3$ and $0 \leq z \leq 0.5$, respectively.

When Ca is employed as $M^1$, Ca may preferably be used singly. However, a part of Ca may be replaced by Sr, Mg, Ba, combination of Sr and Ba, or the like. A part of Ca may be replaced by Sr to thereby adjust the peak of the light-emitting wavelength of a nitride phosphor.

Although Si can be preferably used singly, a part thereof may be replaced by Group IV elements such as C and Ge. When only Si is used, it is possible to obtain a nitride phosphor which is cheap and excellent in crystallinity.

Although Eu constituting an activator is preferably used singly, a part of Eu may be replaced by Sc, Tm, Yb, Y, La, Ce, Pr, Nd, Sm, Gd, Tb, Dy, Ho, Er or Lu. When a part of Eu is replaced by other elements, said other elements act as a co-activator. By doing so, the color tone can be altered and the emission characteristics can be adjusted.

The nitride phosphor may further contain 1-500 ppm of at least one kind of elements selected from the group consisting of Group I elements of Cu, Ag and Au, Group III elements of Ga and In, Group IV elements of Ti, Zr, Hf, Sn and Pb, Group V elements of P, Sb and Bi, and Group VI elements of S. By the addition of any of these elements, it is possible to adjust the emission efficiency.

In this nitride phosphor, the molar concentration of Fe, Ni, Cr, Ti, Nb, Sm and Yb may preferably be confined to not more than 0.01 based on the molar concentration of $M^1$. The reason is that if a large amount of Fe, Ni, Cr, Ti, Nb, Sm or Yb is contained in the nitride phosphor, the emission luminance may be deteriorated.

(Green-Emitting Phosphor 1)

As for the green-emitting phosphor, it is possible to employ those represented by the following general formula (II):

$$Ba_{5-x-y}Eu_xM^2{}_ySi_mO_{5+2m} \qquad (II)$$

(In this formula, $M^2$ is at least one kind of element selected from Ca and Sr; and x, y and m are numbers satisfying $0.0001 \leq x \leq 0.3$, $0 \leq y \leq 0.8$ and $2.5 < m < 3.5$)

In the case of this silicate type phosphor, the excitation efficiency thereof would become lower when it is excited by the light of the wavelength which is longer than about 485 nm. Therefore, this silicate type phosphor can be more efficiently excited by the light of the shorter wavelength which is not more than 485 nm. Especially this silicate type phosphor is excited at a high efficiently by the light of the shorter wavelength which is not more than 460 nm.

When this silicate type phosphor is excited, it is enabled to emit the light having an emission peak wavelength falling within the range of 495-584 nm. The emission peak wavelength of this silicate type phosphor can be altered by variously changing the composition of the phosphor or by changing the excitation wavelength.

The subscripts x, y and m in this silicate type phosphor are numbers satisfying $0.0001 \leq x \leq 0.3$, $0 \leq y \leq 0.8$, $2.5 < m < 3.5$. So long as these subscripts are confined within these ranges, it is possible to obtain a phosphor having an emission peak wavelength falling within the region of 495-584 nm and emitting light in a region from green to yellow with high luminance. It is more preferable that x is confined within the range of $0.1 \leq x \leq 0.5$. When x is confined within this range, it is possible to achieve higher luminance. Further, m may preferably be confined within the range of $2.5 < m \leq 3.2$. When m is confined within this range, it is possible to achieve higher luminance. Furthermore, when y is altered, it is possible to obtain a phosphor exhibiting various color tones.

(Green-Emitting Phosphor 2)

As for the green-emitting phosphor, it is also possible to employ those represented by the following general formula (III):

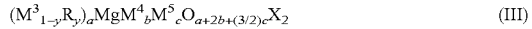

(In this formula, $M^3$ is at least one kind of element selected from the group consisting of Ca, Sr, Ba, Zn and Mn; $M^4$ is at least one kind of element selected from the group consisting of Si, Ge and Sn; $M^5$ is at least one kind of element selected from the group consisting of B, Al, Ga and In; X is at least one kind of element selected from the group consisting of F, Cl, Br and I; R is at least one kind of rare earth element essentially including Eu; and y, a, b and c are numbers satisfying $0.0001 \leq y \leq 0.3$, $7.0 \leq a < 10.0$, $3.0 \leq b < 5.0$, $0 \leq c < 1.0$)

This phosphor contains at least one kind of element selected from the group consisting of Ca, Sr, Ba, Zn and Mn, Ca being more preferable among these elements. When this phosphor contains Ca, a part of Ca may be replaced by Mn, Sr or Ba.

This phosphor contains at least one kind of element selected from the group consisting of Si, Ge and Sn, Si being more preferable among these elements. When this phosphor contains Si, a part of Si may be replaced by Ge or Sn.

This phosphor contains at least one kind of element selected from the group consisting of F, Cl, Br and I, Cl being more preferable among these elements. When this phosphor contains Cl, a part of Cl may be replaced by F, Br and I.

This phosphor contains at least one kind of rare earth element essentially including Eu. The term rare earth elements is a generic term referring to 17 kinds, in total, of elements including scandium, yttrium and lanthanoid, Eu being most preferable among these rare earth elements. In the employment of this phosphor, a part of Eu may be replaced by Ce, Pr, Nd, Sm, Tb, Dy, Ho, Er, Tm or Yb. More preferably, a part of Eu may be replaced by Ce, Pr, Nd, Sm, Tb, Dy, Ho or Tm.

The green phosphor represented by the aforementioned general formula (III) is enabled to exhibit an emission peak wavelength in the wavelength region ranging from green region to yellow region, i.e., in the range of 495-584 nm. For example, when the green phosphor contains Ca, Eu, Mg, Si, O and Cl, it is enabled to exhibit an emission peak wavelength in the vicinity of 500-520 nm. When the green phosphor contains Ca, Mn, Eu, Mg, Si, O and Cl, it is enabled to exhibit an emission peak wavelength in the vicinity of 530-570 nm. However, the emission peak wavelength may be fluctuated depending on the quantities of the elements to be contained or the composition of the green phosphor.

(Green-Emitting Phosphor 3)

As for the green-emitting phosphor, it is also possible to employ those represented by the following general formula (IV) or (V):

or

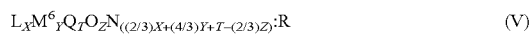

(In this formula, L is at least one kind of Group II element selected from the group consisting of Be, Mg, Ca, Sr, Ba and Zn; $M^6$ is at least one kind of Group IV element selected from the group consisting of C, Si, Ge, Sn, Ti, Zr and Hf; Q is at least one kind of Group III element selected from the group consisting of B, Al, Ga and In; R is one kind of rare earth elements; and X, Y, T and Z are numbers satisfying $0.5 < X < 1.5$, $1.5 < Y < 2.5$, $0 < T < 0.5$, $1.5 < Z < 2.5$).

The oxynitride phosphor represented by the above general formula (IV) or (V) is constructed such that at least a portion thereof includes a crystal where elements are arranged in accordance with a fixed regulation, thereby enabling the light of high luminance to be efficiently emitted from the crystal. When X, Y, T and Z are set to the ranges of $0.5 < X < 1.5$, $1.5 < Y < 2.5$, $0 < T < 0.5$, $1.5 < Z < 2.5$ in the aforementioned general formula, the crystal habit acting as a light-emitting portion can be relatively easily created, thereby making it possible to obtain a phosphor which is excellent in emission efficiency and high in luminance.

Incidentally, if it is desired to set the amount of the crystal contained in the phosphor to a desired value for the purpose of adjusting the light-emitting luminance, the adjustment can be achieved by regulating the values of X, Y and Z in the above general formula (IV). However, though the aforementioned range is preferable, the present invention is not limited to the aforementioned range.

Further, in this green phosphor, the ratio between O and N can be changed. Further, it is also possible to change the molar ratio between the cation and the anion represented by $(L+M^6)/(O+N)$. By doing so, it is possible to delicately adjust the emission spectrum and the emission intensity. This can be achieved by detaching N or O by treating the phosphor by leaving it in a vacuum for example. However, the present invention is not limited to any particular method.

The composition of this phosphor may contain at least one kind of element selected from the group consisting of Li, Na, K, Rb, Cs, Mn, Re, Cu, Ag and Au. The addition of these elements is effective in adjusting the light-emitting efficiency such as luminance, quantum efficiency, etc. Furthermore, other elements may be contained in the phosphor to such an extent that may not obstruct the characteristics of the phosphor.

A part of the Group II elements contained in this phosphor may be replaced by the activator agent R. With respect to the mixing ratio between the Group II elements and the activator agent R, the quantity of the activator agent R may preferably be confined to: (a total amount of Group II elements and the activator agent R):(amount of activator agent R)=1:0.001-1:0.8 in molar ratio.

Further, L is at least one kind of Group II element selected from the group consisting of Be, Mg, Ca, Sr, Ba and Zn. L may be a simple substance such as Ca, Sr, etc., or it may be a combination of a plurality of elements such as a combination of Ca and Sr, of Ca and Ba, of Sr and Ba, of Ca and Mg, etc. Further, when L is constituted by a combination of a plurality of elements, the composition ratio may be variously selected. Especially, L may preferably be at least one kind of Group II element selected from the group consisting of Mg, Ca, Sr, Ba and Zn, wherein any one of Ca, Sr and Ba is essentially included.

$M^6$ is at least one kind of Group IV element selected from the group consisting of C, Si, Ge, Sn, Ti, Zr and Hf. $M^6$ may also be a simple substance such as Si, Ge, etc., or it may be a combination of a plurality of elements such as a combination of Si and C, etc. Although it is possible, according to the present invention, to employ aforementioned Group IV elements, it is especially preferable to employ Si or Ge. When Si or Ge is employed, it is possible to provide a phosphor which is low in manufacturing cost and excellent in crystallinity. Especially, $M^6$ may preferably be at least one kind of Group IV element selected from the group consisting of C, Si, Ge, Sn, Ti and Hf, wherein Si is essentially included.

Q is at least one kind of Group III element selected from the group consisting of B, Al, Ga and In.

As for L, $M^6$ and Q constituting major components of the matrix of aforementioned phosphor, they may be selected from metals, oxides, imide, amide, nitride and various kinds of salts.

Further, R represents a rare earth element. Specifically, one or at least two kinds of elements selected from the group consisting of La, Ce, Pr, Nd, Sm, Eu, Gd, Tb, Dy, Ho, Er, Tm, Yb and Lu. In the present invention, Eu is preferably employed among these rare earth elements. Further, R may include one or more kinds of rare earth elements in addition to Eu. In this case, R may preferably be constituted by not less than 50 mass %, more preferably not less than 70 mass % of Eu. Namely, the activator agent R may preferably be at least one kind of elements selected from the group consisting of La, Ce, Pr, Nd, Sm, Eu, Gd, Tb, Dy, Ho, Er, Tm, Yb and Lu, wherein Eu is essentially included. The elements other than Eu act as a co-activator.

(Green-Emitting Phosphor 4)

As for the green-emitting phosphor, it is also possible to employ those represented by the following general formula (VI):

$$(M^7{}_{1-X}Eu_X)_2Si_YO_{2Y+2} \qquad (VI)$$

(In this formula, $M^7$ is at least one kind of Group II element selected from the group consisting of Be, Mg, Ca, Sr, Ba and Zn; and X and Y are numbers satisfying $0.001 \leq X \leq 0.2$ and $0.9 \leq Y \leq 1.1$, respectively)

In the case of this silicate type phosphor, the excitation efficiency thereof would become lower when it is excited by the light of the wavelength which is longer than about 490 nm. Therefore, this silicate type phosphor can be more efficiently excited by the light of the shorter wavelength which is not more than 490 nm. Especially this silicate type phosphor is excited at a high efficiently by the light of the shorter wavelength which is not more than 460 nm.

When this silicate type phosphor is excited, it is enabled to emit the light having an emission peak wavelength falling within the range of 490-580 nm. The emission peak wavelength of this silicate type phosphor can be altered by variously changing the composition of the phosphor or by changing the excitation wavelength.

The subscripts X and Y in the composition of this silicate type phosphor may preferably be confined to the ranges of: $0.001 \leq X \leq 0.2$ and $0.9 \leq Y \leq 1.1$. So long as these X and Y are confined within these ranges, it is possible to obtain a phosphor having an emission peak wavelength falling within the range of 490-580 nm and emitting light in a region from green to yellow with high luminance. It is more preferable that X is confined within the range of $0.005 \leq X \leq 0.1$. When X is confined within this range, it is possible to achieve higher luminance. Further, when $M^7$ is altered, it is possible to provide a phosphor exhibiting various color tones.

The color filter according to one embodiment of the present invention is employed in a liquid crystal display device including, as a backlight, a white-emitting LED device which emits a white light arising from a color mixture created through a combination of a blue-emitting LED, a red-emitting phosphor and a green-emitting phosphor. This color filter comprises color pixels of plural colors including at least a red pixel on the transparent substrate. In this case, these color pixels of plural colors are respectively constituted by an organic pigment and a color layer containing a transparent resin as a major component, these plural colors being constituted by a combination of red, green and blue (R, G, B), a combination of yellow, magenta and cyan (Y, M, C), or a combination of yellow, magenta and cyan which further contain orange.

The color filter according to this embodiment can be applied especially suitably to a color filter having a red pixel (i.e., RGB system). Further, this color filter can be applied also to a color filter wherein pixels of Y, M, and C are arranged on the same substrate on which pixels of R, G, and B are arranged.

Furthermore, in the case of the color filter according to this embodiment, it is possible to realize, in the red display, a chromaticity which is confined within the region bounded by lines connecting four points (0.620, 0.280), (0.620, 0.300), (0.680, 0.315) and (0.680, 0.280) based on an xy chromaticity coordinate system. The pigment contained in a red photosensitive coloring composition to be used in forming red pixels will be characterized by the following features.

Namely, the pigment contains at least PR 177 and PR 254, wherein not less than 25% and less than 80%, more preferably not less than 45% and less than 80% of the entire organic pigments in the solid matters of the red photosensitive coloring composition is occupied by the PR 177.

If the content of PR177 is less than 25%, the chromaticity value y may exceed the upper limit of the chromaticity range which is required for perceiving red, thereby rendering red to be perceived as orange color. Further, in the case where the pigment contains PR 177 and PR 254, as the value x becomes higher, the value y also becomes higher, and furthermore, in the case where the content of PR 177 is low, the value y becomes even higher. Therefore, in the case where the backlight has a small effects on deepening the redness, i.e., where a minimum relative luminescent intensity in a wavelength range between the second peak wavelength and the third peak wavelength of the backlight spectrum is not less than 55% and less than 70% of the lower one of a relative luminescent intensity value at the second peak wavelength and a relative luminescent intensity value at the third peak wavelength, the value x exceeds the upper limit of the chromaticity range which is required for perceiving red in a region of high x value, then red is perceived as orange color. Accordingly, in the case where the pigment contains PR 177 and PR 254, the content of pigment PR 177 may preferably be not less than 45%.

However, although it is possible to decrease the value y by increasing the content of PR 177 to thereby enhance the effects to deepen the redness and to achieve the target chromaticity, the absorption wavelength region of a curing component (initiator) would be obstructed, thus making it impossible to form a tapered configuration, and, at the same time, coloring power would become weaker and the film thickness would be increased, thereby making it inconsistent with the retention of photolithographic properties. Therefore, the content of PR 177 may preferably be limited to less than 80%.

Further, the color filter according to this embodiment may be constructed such that as long as it is possible to realize, in the red display, a chromaticity which is confined within the region bounded by lines connecting four points (0.620, 0.280), (0.620, 0.300), (0.680, 0.315) and (0.680, 0.280) based on an xy chromaticity coordinate system, a red photosensitive coloring composition used in forming red pixels may contain a yellow pigment such as C.I. Pigment PY 150, PY 139, PY 138, PY 185, PY 13, etc.

The spectral transmission characteristics of the red pixel of the color filter according to this embodiment for enabling the pixel to have a specified color of deep red in combination with the backlight may not be specified since it is variable in its range depending on the spectral characteristics of backlight. However, where the position of the minimum relative luminescent intensity shifts to a shorter wavelength side, it is preferable to shift the position of wavelength of 50% transmittance of red pixel from 580 nm to a longer wavelength side depending on the distribution of emission spectrum.

Next, the construction of the white-emitting LED device as a backlight device employed in the liquid crystal display device according to one embodiment of the present invention will be explained in detail.

Figure 4:
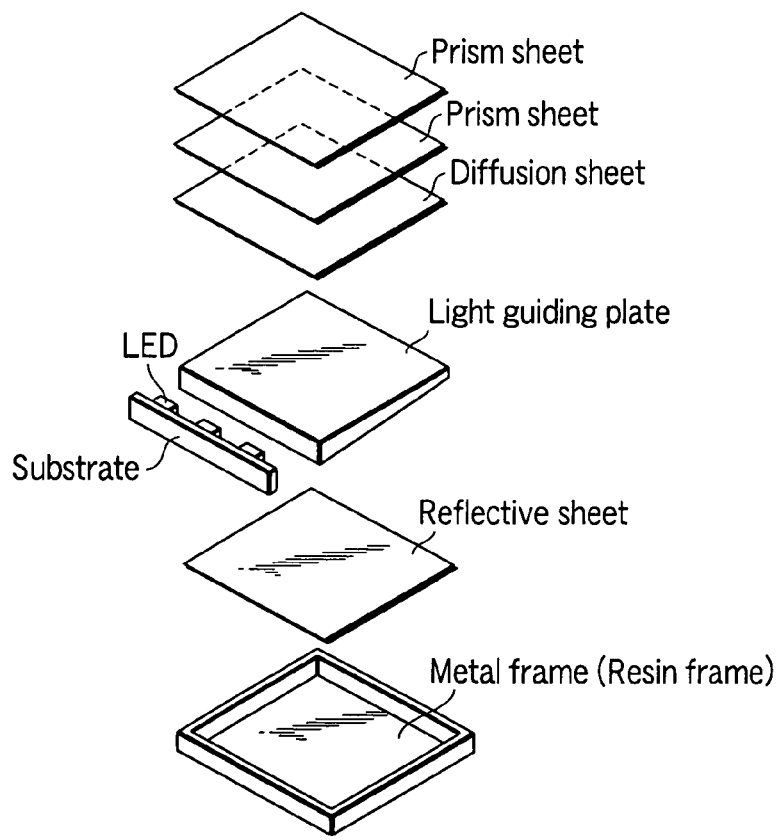
FIG. 4 is a diagram illustrating the construction of an LED backlight device.

One example of the construction of the white-emitting LED device as a backlight device employed in the liquid crystal display device according to one embodiment of the present invention is shown as an assembly diagram shown in FIG. 4. Namely, a reflective sheet, a light-guiding plate provided with a plurality of LEDs (a surface-mounting type light-emitting device) on its sidewall, a diffusion sheet and a couple of prism sheets are successively laminated in a metal frame (or a resin frame), thereby constructing the backlight device formed of white-emitting LED device. Incidentally, these LEDs (a surface-mounting type light-emitting device) are secured to a substrate.

Figure 5:
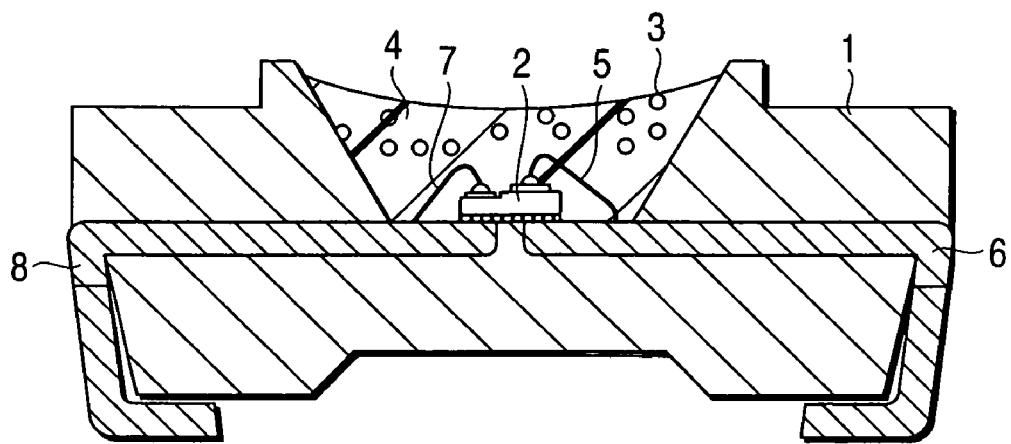
FIG. 5 is a cross-sectional view illustrating the construction of a white-emitting LED device.

One example of the construction of LED is shown in FIG. 5. Although the LED shown herein is of a surface-mounting type light-emitting device, it may not be limited to such a construction but may be an insertion type light-emitting device which has been conventionally employed. This surface-mounting type light-emitting device is provided with a light-emitting element 2 which is adhered, by making use of a die-bonding agent, to the bottom of the recessed portion of a light-emitting element-mounting housing 1, this recessed portion being opened upward. This light-emitting element 2 is covered by a light-transmitting resin 4 having a phosphor 3 dispersed therein. This light-emitting element 2 is provided with an upper electrode and a lower electrode, the upper electrode being connected with a first outer electrode 6 by means of a first wire 5 and the lower electrode being connected with a second outer electrode 8 by means of a second wire 7. Incidentally, the inner surface of the recessed portion of light-emitting element-mounting housing 1 is covered with a light-reflecting material. The light-emitting element is provided with a light-emitting layer which is made of a gallium nitride-based compound semiconductor and is capable of emitting a light of a first peak wavelength in the emission spectrum of the white-emitting LED device to be employed in the present invention. This light-emitting element acts as an excitation light source for the aforementioned red-emitting phosphor and green-emitting phosphor. As for specific examples of the nitride-based compound semiconductor (general formula: $In_iGa_jAl_kN$; wherein $0 \leq i$, $0 \leq j$, $0 \leq k$, and $i+j+k=1$), they include InGaN, GaN doped with various kinds of impurities, etc. This element can be created by growing a semiconductor such as InGaN, GaN, etc., as a light-emitting layer on the surface of a substrate by means of MOCVD, etc.

As for the construction of semiconductor, it includes a homo-structure, a hetero-structure or a double hetero-structure having a MIS junction, a PI junction, a PN junction, etc. The nitride semiconductor layer may be constructed such that the emission wavelength thereof may be variously selected by suitably selecting the material and crystallinity thereof. Further, the semiconductor active layer may be constructed as a single quantum well structure or a multiple quantum well structure constituted by a thin film which is enabled to exhibit quantum effects.

Next, there will be explained in detail about the color filter to be used in the liquid crystal display device of the present invention.

As for the transparent substrate to be employed in the color filter, it is preferable to employ those exhibiting a certain degree of transmittance to visible light, more preferably those exhibiting a light transmittance of not less than 80%. Generally, it is possible to employ those used in ordinary liquid crystal display devices, examples thereof including a plastic substrate such as a polyethylene terephthalate (PET) substrate and a glass substrate. Generally, it is preferable to employ a glass substrate. In the case where a light-shielding pattern is to be employed, it is possible to employ a transparent substrate having the light-shielding pattern formed thereon. The light-shielding pattern can be formed by a conventional method using a metallic thin film made of chromium, etc., or a light-shielding resin.

With respect to the method of creating pixels on the transparent substrate, it is possible to employ any of the known methods including an ink jet method, a printing method, a photo-resist method and an etching method. However, when high definition, the controllability of spectral characteristics and the reproducibility are taken into consideration, it is preferable to employ a photo-resist method. In this photo-resist method, a pigment is dispersed in a transparent resin, and the resultant dispersion is mixed into a suitable solvent together with a photo initiator and a polymeric monomer to form a coloring composition. This coloring composition layer is then subjected to patterning exposure and to development, thereby creating pixels of one color. These steps are repeated for each of colors to manufacture a color filter.

With respect to the method of forming a coloring layer constituting the pixels of the color filter, it may be performed as follows for example. First of all, a coloring composition is prepared as described above. In order to disperse the pigment as a coloring agen in a transparent resin, it is possible to employ various kinds of device including a mill base, a triple roll, a jet mill, etc. Namely, there is not any particular limitation with regard to the method of dispersing the pigment.

The following are specific examples of the organic pigment that can be used in the coloring composition for forming the pixels of color filter, these organic pigments being respectively represented by a color index (C.I.) number.

As for the red pigment, it is possible to employ, other than C.I. Pigment Red 254 and PR177, C.I. Pigment Red 7, 9, 14, 41, 48:1, 48:2, 48:3, 48:4, 81:1, 81:2, 81:3, 97, 122, 123, 146, 149, 168, 177, 178, 179, 180, 184, 185, 187, 192, 200, 202, 208, 210, 215, 216, 217, 220, 223, 224, 226, 227, 228, 240, 246, 255, 264, 272, 279, etc.

As for the yellow pigment, it is possible to employ C.I. Pigment Yellow 1, 2, 3, 4, 5, 6, 10, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 144, 146, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, etc.

As for the orange pigment, it is possible to employ C.I. Pigment Orange 36, 43, 51, 55, 59, 61, 71, 73, etc.

As for the green pigment, it is possible to employ C.I. Pigment Green 7, 10, 36, 37, etc.

As for the blue pigment, it is possible to employ C.I. Pigment Blue 15, 15:1, 15:2, 15:3, 15:4, 15:6, 16, 22, 60, 64, 80, etc.

As for the violet pigment, it is possible to employ C.I. Pigment Violet 1, 19, 23, 27, 29, 30, 32, 37, 40, 42, 50, etc.

The above-described pigments may be used singly or in combination of two or more kinds depending on the kind of pixel.

In order to secure excellent coating properties, sensitivity and developing properties of a coloring composition while making it possible to retain balance between the chroma and lightness, the aforementioned organic pigments may be used in combination with an inorganic pigment. As for specific examples of the inorganic pigment, they include metal oxide powder, metal sulfide powder and metal powder, such as yellow lead, zinc yellow, red iron oxide (red iron oxide (III)), cadmium red, ultramarine blue, Prussian blue, chromium oxide green, cobalt green, etc. Further, for the purpose of toning, coloring composition may further contain dyes within the limits which do not deteriorate the heat resistance of the color filter.

The transparent resin to be employed in the coloring composition may preferably have a permeability of not less than 80%, more preferably not less than 95% in a total wavelength range of 400-700 nm of visible light zone. As for specific examples of the transparent resin, it is possible to employ thermoplastic resin, thermosetting resin and photosensitive resin. If required, these transparent resins may be formed of the precursors thereof, i.e., monomers or oligomers which are capable of forming transparent resins as they are cured by the irradiation of radiation. These monomers and oligomers can be used singly or in combination of two or more kinds.

As for the thermoplastic resin, it is possible to employ, for example, butyral resin, styrene-maleic acid copolymer, chlorinated polyethylene, chlorinated polypropylene, polyvinyl chloride, vinyl chloride-vinyl acetate copolymer, polyvinyl acetate, polyurethane resin, polyester resin, acrylic resin, alkyd resin, polystyrene, polyamide resin, rubber type resin, cyclized rubber-based resin, celluloses, polyethylene, polybutadien, polyimide resin, etc. As for the thermosetting resin, it is possible to employ, for example, epoxy resin, benzoguanamine resin, rosin-modified maleic resin, rosin-modified fumaric acid resin, melamine resin, urea resin, phenol resin, etc.

As for the photosensitive resin, it is possible to employ resins obtained by reacting a (metha)acrylic compound having a reactive substituent group such as isocyanate group, aldehyde group, epoxy group, etc., or cinnamic acid, with a linear polymer having a reactive substituent group such as hydroxyl group, carboxyl group, amino group, etc., to introduce a photocrosslinking group such as (metha)acryloyl group, styryl group, etc., into the linear polymer. It is also possible to employ resins obtained by half-esterifying a linear polymer containing an acid anhydride such as styrene-maleic anhydride copolymer or α-olefin-maleic anhydride copolymer with a (metha)acrylic compound having hydroxyl group such as hydroxyalkyl(metha)acrylate.

As for representative examples of the polymeric monomer that can be used as a photo-crosslinking agent, they include various kinds of acrylic ester and methacrylic ester such as trimethylolpropane tri(metha)acrylate, pentaerythritol tri (metha)acrylate, dipentaerythritol hexa(metha)acrylate, ethylene oxide-modified trimethylolpropane tri(metha)acrylate, propylene oxide-modified trimethylolpropane tri(metha) acrylate, etc.

These esters can be used singly or in combination of two or more kinds. Further, if required, for the purpose of appropriately keeping the photo-curability of monomer, other kinds of polymeric monomers or oligomers may be mixed into these esters.

With respect to the specific examples of other kinds of polymeric monomers or oligomers, they include various kinds of acrylic esters and methacrylic esters such as methyl (metha)acrylate, ethyl(metha)acrylate, 2-hydroxyethyl (metha)acrylate, 2-hydroxypropyl(metha)acrylate, cyclohexyl(metha)acrylate, β-carboxyethyl(metha)acrylate, diethyleneglycol di(metha)acrylate, 1,6-hexanediol di(metha)acrylate, triethyleneglycol di(metha)acrylate, tripropyleneglycol di(metha)acrylate, trimethylolpropane tri (metha)acrylate, pentaerythritol tri(metha)acrylate, 1,6-hexanediol diglycidyl ether di(metha)acrylate, bisphenol A diglycidyl ether di(metha)acrylate, neopentylglycol diglycidyl ether di(metha)acrylate, dipentaerythritol hexa(metha)acrylate, tricyclodecanyl(metha)acrylate, ester acrylate, (metha) acrylate of methyloled melamine, epoxy(metha)acrylate, urethane acrylate, etc.; (metha)acrylic acid; styrene; vinyl acetate; hydroxyethylvinyl ether, ethylene glycol divinyl ether, pentaerythritol trivinyl ether, (metha)acryl amide; N-hydroxymethyl(metha)acryl amide; N-vinyl formamide, acrylonitrile; etc.

These monomers and oligomers can be used singly or in combination of two or more kinds.

When the coloring composition is to be cured through the irradiation of ultraviolet rays, a photo-polymerization initiator may be incorporated in the composition. Preferable examples of the photo-polymerization initiator are an acetophenone-based compound such as 4-phenoxy dichloroacetophenone, 4-t-butyl-dichloroacetophenone, diethoxyacetophenone, 1-(4-isopropylphenyl)-2-hydroxy-2-methylpropan-1-on, 1-hydroxycyclohexylphenyl ketone, 2-benzyl-2-dimethylamino-1-(4-morpholinophenyl)-butane-1-on; a benzoin-based compound such as benzoin, benzoin methyl ether, benzoin ethyl ether, benzoin isopropyl ether, benzyldimethyl ketal, etc.; a benzophenone-based compound such as benzophenone, benzoylbenzoic acid, benzoylmethyl benzoate, 4-phenyl benzophenone, hydroxybenzophenone, acrylated benzophenone, 4-benzoyl-4'-methyldiphenyl sulfide, 3,3',4,4'-tetra(t-butylperoxycarbonyl)benzophenone, etc.; a thioxanthone-based compound such as thioxanthone, 2-chlorothioxanthone, 2-methylthioxanthone, isopropylthioxanthone, 2,4-diisopropylthioxanthone, 2,4-diethylthioxanthone, etc.; a triazine-based compound such as 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-piperonyl-4,6-bis(trichloromethyl)-s-triazine, 2,4-bis (trichloromethyl)-6-styryl-s-triazine, 2-(naphtho-1-yl)-4,6- bis(trichloromethyl)-s-triazine, 2-(4-methoxy-naphtho-1-yl)-4,6-bis(trichloromethyl)-s-triazine, 2,4-trichloromethyl-(piperonyl)-6-triazine, 2,4-trichloromethyl(4'-methoxystyryl)-6-triazine, etc.; an oxime ester-based compound such as 1,2-octanedione, 1-[4-(phenylthio)-1,2-(O-benzoyl oxime)], O-(acetyl)-N-(1-phenyl-2-oxo-2-(4'-methoxy-naphthyle)ethylidene)hydroxyl amine, etc.; a phosphine-based compound such as bis(2,4,6-trimethylbenzoyl) phenyl phosphine oxide, 2,4,6-trimethylbenzoylphenyl phosphine oxide, etc.; a quinone-based compound such as 9,10-phenanthrene quinine, camphorquinine, ethylanthraquinone, etc.; a borate-based compound; a carbazole-based compound, an imidazole-based compound; a titanocene-based compound; etc.

These photo-polymerization initiators may be used singly or in combination of two or more kinds. The content of the photo-polymerization initiator may preferably be confined to 0.5-50% by mass, more preferably 3-30% by mass based on a total mass of solid matters in the coloring composition.

The coloring composition may also contain, as a photosensitizer, an amine-based compound such as triethanol amine, methyldiethanol amine, triisopropanol amine, 4-dimethylaminomethyl benzoate, 4-dimethylaminoethyl benzoate, 4-dimethylaminoisoamyl benzoate, 2-dimethylaminoethyl benzoate, 4-dimethylamino-2-ethylhexyl benzoate, N,N-dimethylparatoluidine, 4,4'-bis(dimethylamino)benzophenone, 4,4'-bis(diethylamino)benzophenone, 4,4'-bis(ethylmethylamino)benzophenone, etc.

These photosensitizers can be employed singly or in combination of two or more kinds thereof. With respect to the content of these photosensitizers, it may preferably be confined to the range of 0.5-60% by mass, more preferably 3-40% by mass based on a total weight of the photo-polymerization initiator and the photosensitizer.

Further, if required, the coloring composition may contain a heat crosslinking agent, specific examples of which including, for example, melamine resin, epoxy resin, etc. Specific examples of melamine resin include alkylated melamine resin (methylated melamine resin, butylated melamine resin, etc.), mixed etherified melamine resin, etc. These melamine resins may be of a high condensation type or of a low condensation type. As for the specific examples of epoxy resin, they include, for example, glycerol/polyglycidyl ether, trimethylol propane/polyglycidyl ether, resorcin/diglycidyl ether, neopentyl glycol/diglycidyl ether, 1,6-hexanediol/diglycidyl ether, ethylene glycol(polyethylene glycol)/diglycidyl ether, etc.

These compounds may be used singly or in combination of two or more kinds.

If required, the coloring composition may contain an organic solvent. Specific examples of such an organic solvent include cyclohexanone, ethyl Cellosolve acetate, butyl Cellosolve acetate, 1-methoxy-2-propyl acetate, diethyleneglycol dimethyl ether, ethyl benzene, ethyleneglycol diethyl ether, xylene, ethyl Cellosolve, methyl-n-amyl ketone, propyleneglycol monomethyl ether toluene, methylethyl ketone, ethyl acetate, methanol, ethanol, isopropyl alcohol, butanol, isobutyl ketone, petroleum solvent, etc. These organic solvents may be used singly or in combination of two or more kinds.

Then, the photosensitive coloring composition prepared as described above is coated on the surface of a transparent substrate and subjected to prebaking. With respect to the coating method, it is possible to employ an ordinary method such as spin-coating, dip-coating, die-coating, etc. Namely, as long as it is possible to coat the coloring composition on the surface of the substrate about 40-60 cm×40-60 cm in size to form a film of uniform thickness, there is not any particular limitation with respect to the method of coating. The prebaking may preferably be performed for 10-20 minutes at a temperature of 50-120° C. With respect to the thickness of coated film, it may be optionally determined. However, when spectral transmittance, etc., are taken into account, the film thickness after the prebaking may be generally confined to around 2 μm.

After the substrate has been coated with a photosensitive coloring composition to form a coloring composition layer, it is subjected to exposure through a patterning mask. With respect to the light source for the exposure, it is possible to employ an ordinary high-pressure mercury lamp.

Thereafter, the development of the coloring composition layer that has been subjected to the exposure is performed. As for the developing solution, it is possible to employ an alkaline aqueous solution. Specific examples of the alkaline aqueous solution include an aqueous solution of sodium carbonate, an aqueous solution of sodium hydrogen carbonate, an aqueous solution of a mixture of sodium carbonate and sodium hydrogen carbonate, and any of these aqueous solutions which further contain an appropriate surfactant.

After finishing the development, the resultant coloring composition layer is washed with water and dried to form pixels of any desired single color.

A sequence of the steps described above are repeated for a required number of colors while changing the photosensitive coloring compositions and the patterns, thereby obtaining a color filter provided with a color pattern formed of a combination of required number of pixels of plural colors.

The following are explanation on one example of the construction of liquid crystal display device provided with the white-emitting LED device and the color filter that has been obtained as described above.

Figure 6:
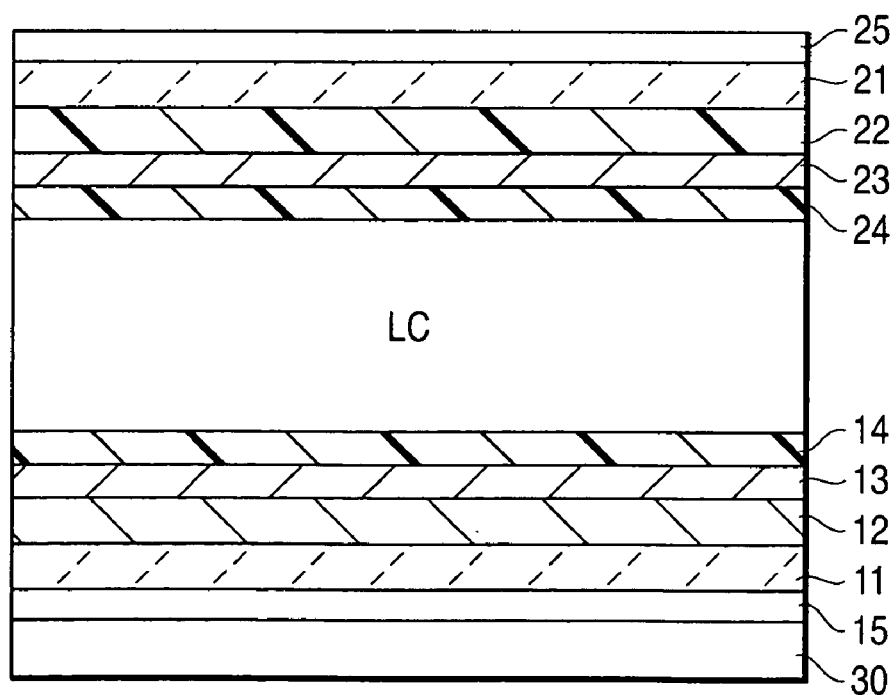
FIG. 6 is a cross-sectional view illustrating a liquid crystal display device.

FIG. 6 is a cross-sectional view schematically illustrating a liquid crystal display device according to one embodiment of the present invention. The liquid crystal display device shown in FIG. 6 is a typical example of a TFT-driving type liquid crystal display device including a pair of transparent substrates 11 and 21 which are disposed to face each other and spaced apart from each other. Between these transparent substrates 11 and 21, a liquid crystal (LC) is introduced and sealed. Various modes of liquid crystal, such as twisted nematic (TN), super twisted nematic (STN), in-plane switching (IPS), vertical alignment (VA), optically compensated birefringence (OCB), a ferroelectric liquid crystal, etc., are applicable to the liquid crystal display device according to one embodiment of the present invention.

Thin-film transistor (TFT) array 12 is formed on the inner surface of a first transparent substrate 11 and a transparent electrode layer 13 made of ITO for example is formed on the TFT array 12. An alignment layer 14 is disposed on the surface of transparent electrode layer 13. A polarizing plate 15 is disposed on the outer surface of the transparent substrate 11.

On the other hand, on the inner surface of a second transparent substrate 21, a color filter 22 is disposed. The filter segments of red, green and blue constituting the color filter 22 are respectively partitioned by a black matrix (not shown). If required, a transparent protective film (not shown) may be deposited so as to cover the color filter 22. Furthermore, a transparent electrode layer 23 made of ITO for example is formed on the surface of transparent protective film, and, still more, an alignment layer 24 is disposed to cover the transparent electrode layer 23. Further, on the outer surface of the transparent substrate 21 is disposed a polarizing plate 25. Incidentally, a backlight unit 30 is disposed below the polarizing plate 15.

EXAMPLES

Next, the present invention will be explained in detail with reference to specific examples, which are not intended to limit the scope of the present invention.

Manufacture of Backlight Device

Manufacturing Example 1 of the Backlight Device Consisting of White-Emitting LED Device Molten polyphthalamide resin is poured into a mold having a pair of positive and negative outer electrodes inserted and sealed therein, from a gate located on the underside of the mold and facing the main surface of a housing. Then, the polyphthalamide resin is allowed to cure, thereby creating a housing. This housing is integrally molded in such a manner that it is provided with a recess in which a light-emitting element is disposed and that the positive and negative outer electrodes are enabled to lead out from the bottom of the recess.

Each of the outer lead portions of the positive and negative outer electrodes that have been exposed through the sides of the housing is bent inward at the opposite side end of the surface located opposite to the light-emitting surface. Then, an LED chip exhibiting a main wavelength peak of 455 nm is die-bonded to the bottom of the recess by using epoxy resin and is electrically connected with each of outer electrodes by a wire.

Then, about 0.25 g of halosilicate $Ca_8MgSi_4O_{16}Cl_2$:Eu having an emission peak in the vicinity of 525 nm and about 0.06 g of a nitride phosphor $CaAlSiBN_3$:Eu having an emission peak in the vicinity of 660 nm are added to and mixed with 3 g of a silicone resin composition to obtain a light-transmitting resin.

Then, the recess of housing is filled with the light-transmitting resin thus obtained to a level of the upper opening of the recess. Finally, the resultant housing is subjected to heat treatment at 70° C. for three hours and at 150° C. for one hour to obtain a white-emitting LED device.

The white-emitting LED device thus obtained is optically connected with a light-guiding plate. Finally, a reflective sheet, the aforementioned light-guiding plate, a diffusion sheet and a prism sheet are successively laminated and fixed together to create a backlight device (1). Incidentally, the construction of the backlight device to be used in the present invention is not limited to the aforementioned structure. Namely, any kinds of backlight structure that have been conventionally employed can be used in the present invention.

According to this backlight device (1), a minimum relative luminescent intensity in the wavelength range between the second peak wavelength and the third peak wavelength of emission spectrum was confined to 47% of lower one of a relative luminescent intensity at the second peak wavelength and a relative luminescent intensity at the third peak wavelength.

Manufacturing Example 2 of the Backlight Device Consisting of White-Emitting LED Device A white-emitting LED device was manufactured in the same manner as described in the above manufacturing example 1 except that about 0.25 g of silicate-based phosphor $(Br, Sr)_2SiO_4$:Eu having an emission peak in the vicinity of 535 nm and about 0.06 g of a nitride phosphor $CaAlSiBN_3$:Eu having an emission peak in the vicinity of 660 nm were added to and mixed with 3 g of a silicone resin composition, thereby obtaining a backlight device (2), i.e., the white-emitting LED device.

According to this backlight device (2), a minimum relative luminescent intensity in the wavelength range between the second peak wavelength and the third peak wavelength of emission spectrum was confined to 64% of lower one of a relative luminescent intensity at the second peak wavelength and a relative luminescent intensity at the third peak wavelength.

Manufacturing Example 3 of the Backlight Device Consisting of White-Emitting LED Device A white-emitting LED device was manufactured in the same manner as described in the above manufacturing example 1 except that about 0.24 g of silicate-based phosphor $(Br, Sr)_2SiO_4$:Eu having an emission peak in the vicinity of 530 nm and about 0.04 g of a nitride phosphor $CaAlSiBN_3$:Eu having an emission peak in the vicinity of 650 nm were added to and mixed with 3 g of a silicone resin composition, thereby obtaining a backlight device (3), i.e., the white-emitting LED device.

According to this backlight device (3), a minimum relative luminescent intensity in the wavelength range between the second peak wavelength and the third peak wavelength of emission spectrum was confined to 75% of lower one of a relative luminescent intensity at the second peak wavelength and a relative luminescent intensity at the third peak wavelength.

A white-emitting LED device was manufactured in the same manner as described in the above manufacturing example 1 except that about 0.4 g of YAG-based phosphor $Y_3Al_5O_{12}$:Ce having an emission peak in the vicinity of 560 nm was added to and mixed with 3 g of a silicone resin composition, thereby obtaining a backlight device (4), i.e., the white-emitting LED device.

Figure 7:
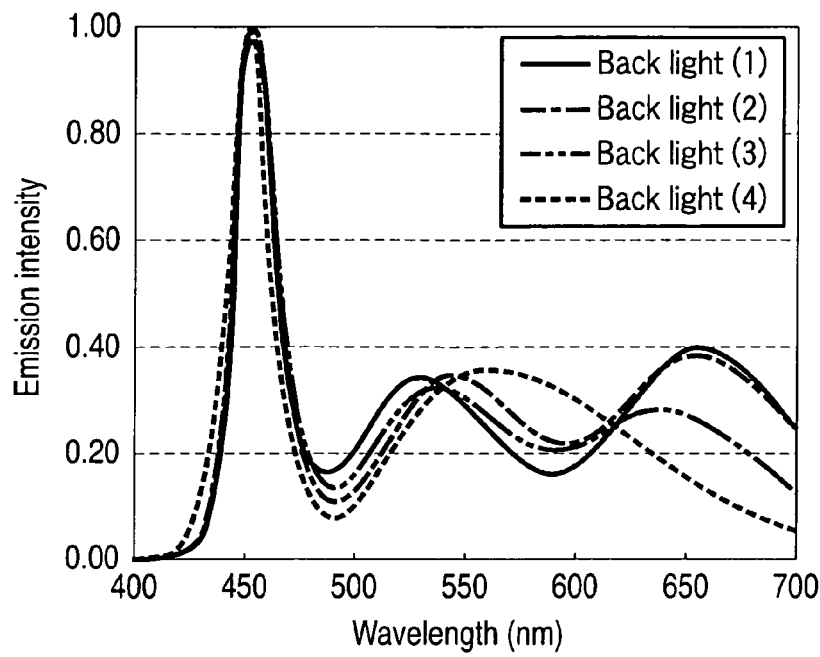
FIG. 7 is a graph illustrating the emission characteristics of the backlight device (1)-(4)

The backlight (1)-(3) obtained in the manufacturing example 1-3 of the backlight device consisting of white-emitting LED device and the backlight device (4) which is a pseudo white-emitting LED device were investigated with respect to the spectrum of relative luminescent intensity as the maximum luminescent intensity thereof was defined as 1, the results being shown in FIG. 7.

PR 254, PR 177 and PY 150 were employed for producing a red photosensitive coloring composition for manufacturing the red pixel of color filter to be used in combination with the aforementioned four kinds of backlight devices, thereby obtaining red photosensitive coloring compositions 1-5 each having pigment contents as shown in the following Table 1.

TABLE 1

|  |  | Red photosensitive coloring composition 1 | Red photosensitive coloring composition 2 | Red photosensitive coloring composition 3 | Red photosensitive coloring composition 4 | Red photosensitive coloring composition 5 |
| --- | --- | --- | --- | --- | --- | --- |
| Content of pigment (wt %) | PR254 | 50 | 70 | 45 | 90 | |
| | PR177 | 50 | 30 | 50 | 10 | 100 |
| | PY150 | | | 5 | | |

Red pixels 1 and 2 were formed by using the red photosensitive coloring compositions 1 and 2 as shown in above Table 1. The film thicknesses of the red pixels 1 and 2 were adjusted so as to realize x=0.680 as they were used in combination with the backlight device (1). The combinations of these red pixels 1 and 2 with the backlight device (1) were designated as Examples 1 and 2, respectively.

Red pixel 3 was formed by using the red photosensitive coloring composition 1. The film thickness of the red pixel 3 was adjusted so as to realize x=0.680 as it was used in combination with the backlight device (2). The combination of this red pixel 3 with the backlight device (2) was designated as Example 3.

Red pixel 4 was formed by using the red photosensitive coloring composition 3. The film thickness of the red pixel 4 was adjusted so as to realize x=0.680 as it was used in combination with the backlight device (1). The combination of this red pixel 4 with the backlight device (1) was designated as Example 4.

Red pixels 5 and 6 were formed by using the red photosensitive coloring compositions 1 and 2. The film thicknesses of the red pixels 5 and 6 was adjusted so as to realize x=0.620 as they were used in combination with the backlight device (1). The combinations of these red pixels 5 and 6 with the backlight device (1) were designated as Examples 5 and 6, respectively.

Red pixel 7 was formed by using the red photosensitive coloring composition 1. The film thickness of the red pixel 7 was adjusted so as to realize x=0.620 as it was used in combination with the backlight device (2). The combination of this red pixel 7 with the backlight device (2) was designated as Example 7.

Red pixel 8 was formed by using the red photosensitive coloring composition 3. The film thickness of the red pixel 8 was adjusted so as to realize x=0.680 as it was used in combination with the backlight device (1). The combination of this red pixel 8 with the backlight device (1) was designated as Example 8.

Figure 8:
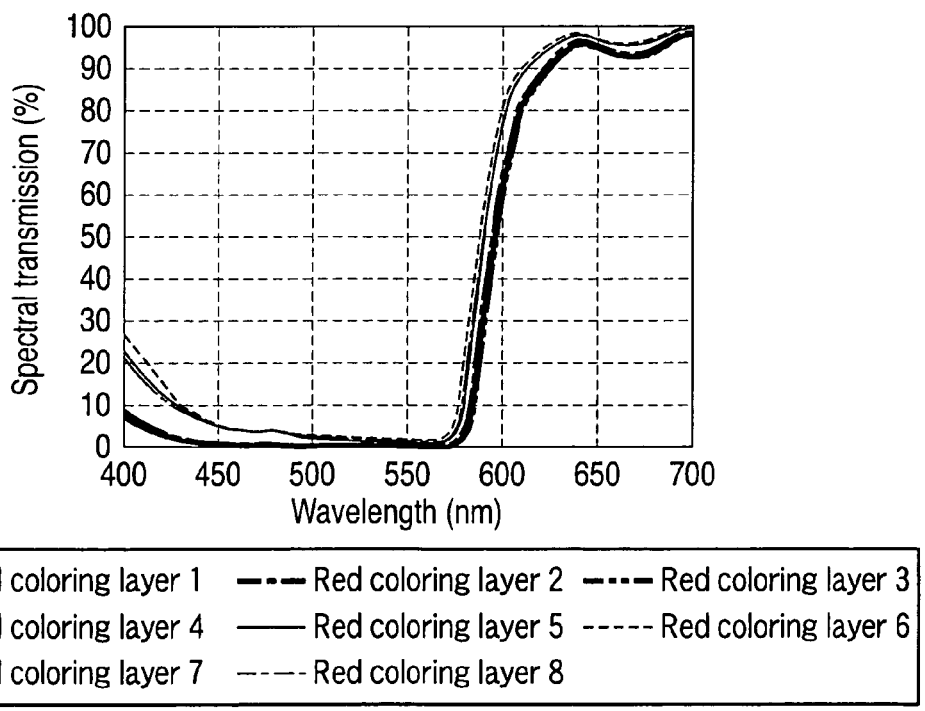
FIG. 8 is a graph illustrating the spectral transmission of the red pixels 1-8.

The spectral transmission characteristic of each of these red pixels 1-8 employed in above Examples 1-8 is shown in FIG. 8.

Red pixel 9 was formed by using the red photosensitive coloring composition 1. The film thickness of the red pixel 9 was adjusted so as to realize x=0.680 as it was used in combination with the backlight device (3). The combination of this red pixel 9 with the backlight device (3) was designated as Comparative Example 1.

Red pixels 10, 11 and 12 were formed by using the red photosensitive coloring composition 4. The film thicknesses of the red pixels 10, 11 and 12 were adjusted so as to realize x=0.680 as they were used in combination with the backlight devices (1), (2) and (3). The combinations of these red pixels 10, 11 and 12 with the backlight devices (1), (2) and (3) were designated as Comparative Examples 2, 3 and 4, respectively.

Red pixel 13 was formed by using the red photosensitive coloring composition 5. The film thickness thereof was adjusted so as to realize x=0.680 as it was used in combination with the backlight device (4). The combination of this red pixel 13 with the backlight device (4) was designated as Comparative Example 5.

Comparative Examples 6-10 were obtained in the same manner as described in Comparative Examples 1-5 except that red pixels 14-18 were formed with the film thickness thereof being adjusted so as to realize x=0.620.

Figure 9:
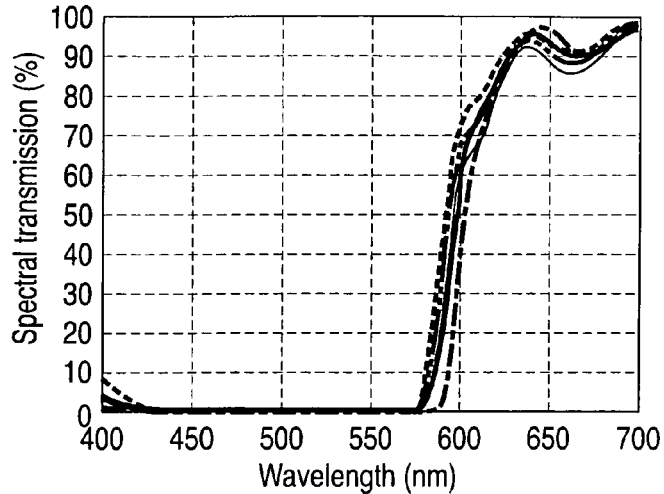
FIG. 9 is a graph illustrating the spectral transmission of the red pixels 9-13.
Figure 10:
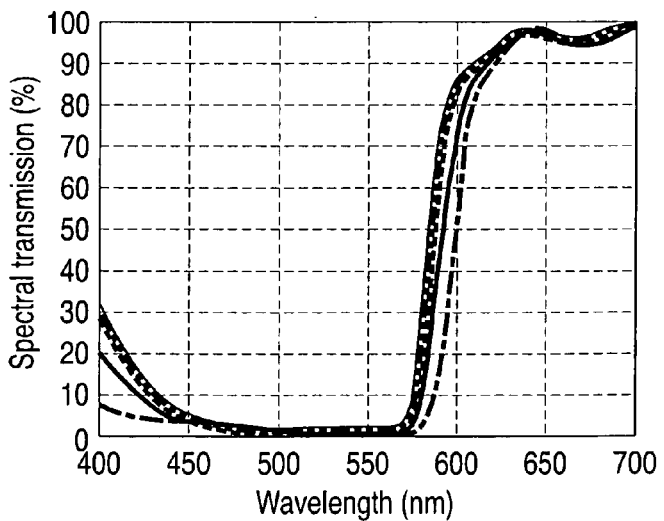
FIG. 10 is a graph illustrating the spectral transmission of the red pixels 14-18.

The spectral transmission of each of these red pixels 9-13 employed in above Comparative Examples 1-5 is shown in FIG. 9 and the spectral transmission of each of these red pixels 14-18 employed in above Comparative Examples 6-10 is shown in FIG. 10.

The red display chromaticity and photolithographic properties of each of Examples and Comparative Examples were assessed according to the following methods.

1. The deepness of red in the backlight device:

(1) A backlight device constituted by a white-emitting LED device exhibiting three ranges of wavelength, i.e., a first peak wavelength of 440-470 nm, a second peak wavelength of 510-550 nm and a third peak wavelength of 630-670 nm, wherein a minimum relative luminescent intensity at the wavelength between the second peak wavelength and the third peak wavelength of emission spectrum is less than 55% of lower one of a relative luminescent intensity at the second peak wavelength and a relative luminescent intensity at the third peak wavelength.

(2) A backlight device constituted by a white-emitting LED device exhibiting three ranges of wavelength, i.e., a first peak wavelength of 440-470 nm, a second peak wavelength of 510-550 nm and a third peak wavelength of 630-670 nm, wherein a minimum relative luminescent intensity in the wavelength range between the second peak wavelength and the third peak wavelength of emission spectrum is confined to 55-70% of lower one of a relative luminescent intensity at the second peak wavelength and a relative luminescent intensity at the third peak wavelength.

(3) A backlight device constituted by a white-emitting LED device exhibiting three ranges of wavelength, i.e., a first peak wavelength of 440-470 nm, a second peak wavelength of 510-550 nm and a third peak wavelength of 630-670 nm, wherein a minimum relative luminescent intensity in the wavelength range between the second peak wavelength and the third peak wavelength of emission spectrum is more than 70% of lower one of a relative luminescent intensity at the second peak wavelength and a relative luminescent intensity at the third peak wavelength.

(4) A backlight device consisting of a two wavelength white-emitting LED device wherein a blue-emitting LED is used in combination with a yellow phosphor.

2. The mixing ratio of pigments in the red photosensitive coloring composition to be employed in the formation of red pixel of color filter:

A: The mixing ratio of pigments in the red photosensitive coloring composition to be employed in the formation of red pixel was: PR177/PR254=80/20-100/0.

B: The mixing ratio of pigments in the red photosensitive coloring composition to be employed in the formation of red pixel was: PR177/PR254=45/55-80/20.

C: The mixing ratio of pigments in the red photosensitive coloring composition to be employed in the formation of red pixel was: PR177/PR254=25/75-45/55.

D: In addition to the pigments PR177/PR254 contained in the red photosensitive coloring composition to be employed in the formation of red pixel, a yellow pigment was contained.

E: The mixing ratio of pigments in the red photosensitive coloring composition to be employed in the formation of red pixel was: PR177/PR254=0/100-25/75.

Incidentally, when value y is larger than the aforementioned range, the red pixel would be perceived as being vermillion color or orange color. Whereas when value y is smaller than the aforementioned range, the red pixel would be perceived as being reddish violet color.

3. Photolithographic properties:

○: Forwardly tapered in cross-section

X: Reversely tapered in cross-section (Results of Assessment)

The results of assessment of Examples 1-6 are shown in the following Table 2.

TABLE 2

| | | Ex. 1<br>Red coloring<br>layer 1 | Ex. 2<br>Red coloring<br>layer 2 | Ex. 3<br>Red coloring<br>layer 3 | Ex. 4<br>Red coloring<br>layer 4 |
|---|---|---|---|---|---|
| Back light | | (1) | (1) | (2) | (1) |
| Minimum relative luminous intensity ratio between $2^{nd}$-$3^{rd}$ peaks | | 47.3% | 47.3% | 63.6% | 47.2% |
| Assessment on back light | | I | I | II | I |
| Red photosensitive coloring composition | | Red photosensitive coloring composition 1 | Red photosensitive coloring composition 2 | Red photosensitive coloring composition 1 | Red photosensitive coloring composition 3 |
| Content of pigment (w %) | PR254 | 50 | 70 | 50 | 45 |
| | PR177 | 50 | 30 | 50 | 50 |
| | PY150 | | | | 5 |
| Assessment on pigment ratio | | B | C | B | D |
| x | | 0.680 | 0.680 | 0.680 | 0.680 |
| y | | 0.308 | 0.312 | 0.312 | 0.310 |
| Y | | 17.98 | 18.63 | 17.63 | 18.33 |
| Red color display | | ○ | ○ | ○ | ○ |
| Photolithographic properties | | ○ | ○ | ○ | ○ |

| | | Ex. 5<br>Red coloring<br>layer 5 | Ex. 6<br>Red coloring<br>layer 6 | Ex. 7<br>Red coloring<br>layer 7 | Ex. 8<br>Red coloring<br>layer 8 |
|---|---|---|---|---|---|
| Back light | | (1) | (1) | (2) | (1) |
| Minimum relative luminous intensity ratio between $2^{nd}$-$3^{rd}$ peaks | | 47.3% | 47.3% | 63.6% | 47.3% |
| Assessment on back light | | I | I | II | I |
| Red photosensitive coloring composition | | Red photosensitive coloring composition 1 | Red photosensitive coloring composition 2 | Red photosensitive coloring composition 1 | Red photosensitive coloring composition 3 |
| Content of pigment (w %) | PR254 | 50 | 70 | 50 | 50 |
| | PR177 | 50 | 30 | 50 | 45 |
| | PY150 | | | | 5 |
| Assessment on pigment ratio | | B | C | B | D |
| x | | 0.620 | 0.620 | 0.620 | 0.620 |
| y | | 0.294 | 0.299 | 0.300 | 0.299 |
| Y | | 21.31 | 22.37 | 21.74 | 21.96 |
| Red color display | | ○ | ○ | ○ | ○ |
| Photolithographic properties | | ○ | ○ | ○ | ○ |

3. Red color display:

○: The chromaticity value of the red pixel was confined within the region bounded by lines connecting four points (0.620, 0.280), (0.620, 0.300), (0.680, 0.315) and (0.680, 0.280) based on an xy chromaticity coordinate system and the red pixel was perceived as red.

x: The chromaticity value of the red pixel was not confined within the region bounded by lines connecting four points (0.620, 0.280), (0.620, 0.300), (0.680, 0.315) and (0.680, 0.280) based on an xy chromaticity coordinate system and the red pixel was not perceived as red.

It will be recognized from the results of above Table 2 that in the cases of Examples 1-8 wherein a backlight device was constituted by a white-emitting LED device which emit a white light arising from a color mixture created through a combination of a blue-emitting LED, a red-emitting phosphor and a green-emitting phosphor, and this white-emitting LED device was used in combination with a color filter including a red pixel employing a prescribed pigment, it was possible to realize excellent red reproducibility and excellent photolithographic properties.

Incidentally, when a backlight which was high in deepness of red (backlight assessment: I, II) was employed and, at the same time, when a red photosensitive coloring composition where the content of the pigment PR177 exhibiting high deepness in red was not less than 25% and less than 80% (pigment assessment: C, D) was employed for the formation of the red pixel of color filter, it was possible to realize especially excellent red displaying characteristics.

Further, in the case where the same kind of red photosensitive coloring composition was employed, when the a minimum relative luminescent intensity in the wavelength range between the second and the third peak wavelengths was lower in intensity ratio than lower one of those at the second and the third peak wavelengths, it was possible to realize more increased deepness in red and excellent red reproducibility.

Furthermore, in the case where the deepness in red was high, even if a yellow pigment PY150 was contained in a red photosensitive coloring composition (pigment assessment: D) to be employed in the formation of the red pixel of color filter, the red-displaying characteristics thereof was confined within the specified chromaticity range, thereby exhibiting excellent red-displaying characteristics. As apparent from this, as long as the red-displaying characteristics can be confined within the specified chromaticity range, it is possible to realize high deepness in red even if a yellow pigment is contained as a toning agent. However, since the deepness of red would be deteriorated due to the toning by making use of a yellow pigment as compared with the case where a yellow pigment is not incorporated, it is not preferable to excessively contain a yellow pigment.

Next, there will be illustrated the results of assessment of Comparative Examples 1-5 in the following Table 3 and the results of assessment of Comparative Examples 6-10 in the following Table 4.

TABLE 3

|  |  | Comp. Ex. 1 Red coloring layer 9 | Comp. Ex. 2 Red coloring layer 10 | Comp. Ex. 3 Red coloring layer 11 | Comp. Ex. 4 Red coloring layer 12 | Comp. Ex. 5 Red coloring layer 13 |
|---|---|---|---|---|---|---|
| Back light | | (3) | (1) | (2) | (3) | (4) |
| Minimum relative luminous intensity ratio between $2^{nd}$-$3^{rd}$ peaks | | 74.6% | 47.3% | 63.6% | 74.6% | — |
| Assessment on back light | | III | I | II | III | IV |
| Red photosensitive coloring composition | | Red photosensitive coloring composition 1 | Red photosensitive coloring composition 4 | Red photosensitive coloring composition 4 | Red photosensitive coloring composition 4 | Red photosensitive coloring composition 5 |
| Content of pigment (%) | PR254 | 50 | 90 | 90 | 90 | |
| | PR177 | 50 | 10 | 10 | 10 | 100 |
| | PY150 | | | | | |
| Assessment on pigment ratio | | B | E | E | E | A |
| x | | 0.680 | 0.680 | 0.680 | 0.680 | 0.680 |
| y | | 0.316 | 0.316 | 0.319 | 0.320 | 0.316 |
| Y | | 15.76 | 19.17 | 18.16 | 15.56 | 10.77 |
| Red color display | | X | X | X | X | X |
| Photolithographic properties | | ○ | ○ | ○ | ○ | X |

TABLE 4

|  |  | Comp. Ex. 6 Red coloring layer 14 | Comp. Ex. 7 Red coloring layer 15 | Comp. Ex. 8 Red coloring layer 16 | Comp. Ex. 9 Red coloring layer 17 | Comp. Ex. 10 Red coloring layer 18 |
|---|---|---|---|---|---|---|
| Back light | | (3) | (1) | (2) | (3) | (4) |
| Minimum relative luminous intensity ratio between $2^{nd}$-$3^{rd}$ peaks | | 74.6% | 47.3% | 63.6% | 74.6% | — |
| Assessment on back light | | III | I | II | III | IV |
| Red photosensitive coloring composition | | Red photosensitive coloring composition 1 | Red photosensitive coloring composition 4 | Red photosensitive coloring composition 4 | Red photosensitive coloring composition 4 | Red photosensitive coloring composition 5 |
| Content of pigment (%) | PR254 | 50 | 90 | 90 | 90 | |
| | PR177 | 50 | 10 | 10 | 10 | 100 |
| | PY150 | | | | | |
| Assessment on pigment ratio | | B | E | E | E | A |
| x | | 0.620 | 0.620 | 0.620 | 0.620 | 0.620 |
| y | | 0.304 | 0.304 | 0.312 | 0.316 | 0.302 |
| Y | | 20.21 | 23.52 | 24.43 | 22.89 | 14.52 |
| Back light | | III | I | II | III | IV |
| Ratio of pigment | | B | E | E | E | A |
| Red color display | | X | X | X | X | X |
| Photolithographic properties | | ○ | ○ | ○ | ○ | X |

Following facts will be realized from above Tables 3 and 4. Namely, as seen from Comparative Examples 1 and 6, even if the backlight device was constituted by a white-emitting LED device which emits a white light arising from a color mixture created through a combination of a blue-emitting LED, a red-emitting phosphor and a green-emitting phosphor, the red-displaying characteristics became inferior and red was perceived as vermillion color or orange color, provided that the deepness of red was low in backlight. The same phenomenon was also recognized even in the case where the ratio of pigment PR177 exhibiting high deepness in red was not less than 45% (pigment assessment: B) in the red photosensitive coloring composition employed in the formation of red pixel of color filter.

Further, as seen from Comparative Examples 2-4 and 7-9, even if the backlight device was constituted by a white-emitting LED device which emits a white light arising from a color mixture created through a combination of a blue-emitting LED, a red-emitting phosphor and a green-emitting phosphor, the red-displaying characteristics became inferior, provided that the red photosensitive coloring composition employed in the formation of red pixel of color filter was formulated such that the ratio of pigment PR177 exhibiting high deepness in red was as low as not more than 25% and the deepness in red was poor (pigment assessment: E). Especially when the deepness in red was low at the backlight (Comparative Examples 4 and 9), orange color-like tone in red became prominent.

Further, as seen from Comparative Examples 5 and 10, in the case where the backlight device was constituted by a two wavelength white-emitting LED device (backlight assessment: IV), even if the red photosensitive coloring composition employed in the formation of red pixel of color filter was formulated such that the ratio of pigment PR177 exhibiting high deepness in red became 100% (pigment assessment: A), the red-displaying characteristics became inferior, thereby rendering red to be perceived as orange-like color. In the case of the white-emitting LED device exhibiting two wavelengths, since an emission peak does not exist in a long wavelength region, there is a limit in increasing the deepness of red by means of the color filter, thus making it difficult to display deep red. Furthermore, when the ratio of pigment PR177 in the red photosensitive coloring composition was significantly increased (pigment assessment: A), the cross-sectional configuration of pattern was caused to become reverse taper-like, thus deteriorating the photolithographic properties of the coloring composition.

It has been found out from the results described above that in order to obtain a liquid crystal display device which makes it possible to realize deep red display and to obtain a color filter excellent in photolithographic properties, the white-emitting LED device to be employed as a backlight device is constructed such that it exhibits an emission spectrum of three-wavelength ranges constituted by a first peak wavelength falling within the range of 440-470 nm, a second peak wavelength falling within the range of 510-550 nm and a third peak wavelength falling within the range of 630-670 nm and that it is high in deepness of red wherein a minimum relative luminescent intensity in the wavelength range between the second peak wavelength and the third peak wavelength is confined to not more than 70% of lower one of a relative luminescent intensity at the second peak wavelength and a relative luminescent intensity at the third peak wavelength. And also, a color filter to be used in combination with this backlight may be constructed such that the red photosensitive coloring composition to be employed in the formation of red pixel is formulated so as to contain, as pigments thereof, at least PR177 and PR254 wherein the PR177 which is excellent in deepness in red is contained at a ratio of not less than 25%, more preferably 45-80%.

What is claimed is:

1. A liquid crystal display device comprising:
a backlight device including a white-emitting LED device which emits a white light arising from a color mixture created through a combination of a blue-emitting LED, a red-emitting phosphor and a green-emitting phosphor, and
a color filter equipping color pixels exhibiting plural colors including a red pixel and formed on a transparent substrate,
wherein the white-emitting LED device is enabled to exhibit an emission spectrum having a first peak wavelength falling within a range of 440-470 nm, a second peak wavelength falling within a range of 510-550 nm and a third peak wavelength falling within a range of 630-670 nm, and a red display chromaticity of the liquid crystal display device is confined within a region bounded by lines connecting four points (0.620, 0.280), (0.620, 0.300), (0.680, 0.315) and (0.680, 0.280) based on an xy chromaticity coordinate system.

2. The liquid crystal display device according to claim 1, wherein a minimum relative luminescent intensity in a wavelength range between the second peak wavelength and the third peak wavelength is not more than 70% of lower one of a relative luminescent intensity at the second peak wavelength and a relative luminescent intensity value at the third peak wavelength.

3. The liquid crystal display device according to claim 1, wherein the red-emitting phosphor is a nitride phosphor activated by Eu and containing Group II elements $M^1$, Si, Al, B and N, which is represented by following general formula (I) and capable of absorbing ultraviolet light or blue light, thereby enabling it to emit red light;

$$M^1{}_w Al_x Si_y B_z N_{(2/3)w+x+(4/3)y+z} : Eu^{2+} \qquad (I)$$

(wherein $M^1$ is at least one kind of element selected from the group consisting of Mg, Ca, Sr and Ba; and w, x, y and z are numbers satisfying $0.056 \leq w \leq 9$, $x=1$, $0.056 \leq y \leq 18$, $0 \leq z \leq 0.5$).

4. The liquid crystal display device according to claim 1, wherein the green-emitting phosphor is represented by following general formula (II);

$$Ba_{5-x-y} Eu_x M^2{}_y Si_m O_{5+2m} \qquad (II)$$

(wherein $M^2$ is at least one kind of element selected from the group consisting of Ca and Sr; and x, y and m are numbers satisfying $0.0001 \leq x \leq 0.3$, $0 \leq y \leq 0.8$, $2.5 < m < 3.5$).

5. The liquid crystal display device according to claim 1, wherein the green-emitting phosphor is represented by following general formula (III);

$$(M^3{}_{1-y} R_y)_a MgM^4{}_b M^5{}_c O_{a+2b+(3/2)c} X_2 \qquad (III)$$

(wherein $M^3$ is at least one kind of element selected from the group consisting of Ca, Sr, Ba, Zn and Mn; $M^4$ is at least one kind of element selected from the group consisting of Si, Ge and Sn; $M^5$ is at least one kind of element selected from the group consisting of B, Al, Ga and In; X is at least one kind of element selected from the group consisting of F, Cl, Br and I; R is at least one kind of rare earth element wherein Eu is essentially included; and y, a, b and c are numbers satisfying $0.0001 \leq y \leq 0.3$, $7.0 \leq a < 10.0$, $3.0 \leq b < 5.0$, $0 \leq c < 1.0$).

6. The liquid crystal display device according to claim 1, wherein the green-emitting phosphor is represented by following general formula (IV) or (V);

$$L_X M^6{}_Y O_Z N_{(2/3)X+(4/3)Y-(2/3)Z}:R \quad (IV)$$

$$L_X M^6{}_Y Q_T O_Z N_{(2/3)X+(4/3)Y+T-(2/3)Z}:R \quad (V)$$

(wherein L is at least one kind of Group II element selected from the group consisting of Be, Mg, Ca, Sr, Ba and Zn; $M^6$ is at least one kind of Group IV element selected from C, Si, Ge, Sn, Ti, Zr and Hf; Q is at least one kind of Group III element selected from the group consisting of B, Al, Ga and In; R is at least one kind of rare earth element; and X, Y, T and Z are numbers satisfying 0.5<X<1.5, 1.5<Y<2.5, 0<T<0.5, 1.5<Z<2.5).

7. The liquid crystal display device according to claim 1, wherein the green-emitting phosphor is represented by following general formula (VI);

$$(M^7{}_{1-X}Eu_X)_2 Si_Y O_{2Y+2} \quad (VI)$$

(wherein $M^7$ is at least one kind of Group II element selected from the group consisting of Be, Mg, Ca, Sr, Ba and Zn; and X and Y are numbers satisfying 0.001≦X≦0.2, 0.9≦Y≦1.1).

8. The liquid crystal display device according to claim 1, wherein the red pixel is formed by using a red photosensitive coloring composition which contains an organic pigment including at least C.I. Pigment No. PR177 and C.I. Pigment No. PR254 wherein not less than 25% and less than 80% of a total organic pigment in solid matters of the red photosensitive coloring composition is occupied by the C.I. Pigment No. PR177.

9. A liquid crystal display device comprising:
a backlight device including a white-emitting LED device which emits a white light arising from a color mixture created through a combination of a blue-emitting LED, a red-emitting phosphor and a green-emitting phosphor, and
a color filter equipping color pixels exhibiting plural colors including a red pixel and formed on a transparent substrate,
wherein the white-emitting LED device is enabled to exhibit an emission spectrum having a first peak wavelength falling within a range of 440-470 nm, a second peak wavelength falling within a range of 510-550 nm and a third peak wavelength falling within a range of 630-670 nm, a minimum relative luminescent intensity in a wavelength range between the second peak wavelength and the third peak wavelength is not more than 70% of lower one of a relative luminescent intensity at the second peak wavelength and a relative luminescent intensity at the third peak wavelength, and the red pixel has a pigment composition and a film thickness, enabling a red display chromaticity of the liquid crystal display device to confine within a region bounded by lines connecting four points (0.620, 0.280), (0.620, 0.300), (0.680, 0.315) and (0.680, 0.280) based on an xy chromaticity coordinate system.

10. The liquid crystal display device according to claim 9, wherein the red pixel is formed by using a red photosensitive coloring composition which contains an organic pigment including at least C.I. Pigment No. PR177 and C.I. Pigment No. PR254 wherein not less than 25% and less than 80% of a total organic pigment in solid matters of the red photosensitive coloring composition is occupied by the C.I. Pigment No. PR177.

11. A color filter to be employed in the liquid crystal display device defined in claim 1, which comprises a transparent substrate, and color pixels exhibiting plural colors including a red pixel and formed on the transparent substrate, wherein the red pixel has such a pigment composition and film thickness that a red display chromaticity of the liquid crystal display device is confined within a region bounded by lines connecting four points (0.620, 0.280), (0.620, 0.300), (0.680, 0.315) and (0.680, 0.280) based on an xy chromaticity coordinate system.

* * * * *